United States Patent [19]
McClure et al.

[11] Patent Number: 6,027,860
[45] Date of Patent: Feb. 22, 2000

[54] METHOD FOR FORMING A STRUCTURE USING REDEPOSITION OF ETCHABLE LAYER

[75] Inventors: Brent A. McClure; Daryl C. New, both of Boise, Id.

[73] Assignee: Micron Technology, Inc., Boise, Id.

[21] Appl. No.: 09/103,202

[22] Filed: Jun. 23, 1998

Related U.S. Application Data

[63] Continuation of application No. 08/905,785, Aug. 13, 1997.
[51] Int. Cl.⁷ ........................................................ G03F 7/36
[52] U.S. Cl. ........................ 430/314; 430/316; 430/317; 430/318; 438/695; 438/696; 438/700; 438/703
[58] Field of Search .................................... 430/313, 314, 430/318, 320, 316, 317; 156/648.1; 438/695, 696, 700, 703

[56] References Cited

U.S. PATENT DOCUMENTS

| | | | |
|---|---|---|---|
| 5,185,058 | 2/1993 | Cathey | 156/656 |
| 5,320,981 | 6/1994 | Blalock | 437/195 |
| 5,354,705 | 10/1994 | Mathews et al. | 437/52 |
| 5,438,011 | 8/1995 | Blalock et al. | 437/52 |
| 5,451,543 | 9/1995 | Woo et al. | 437/195 |
| 5,792,593 | 8/1998 | McClure et al. | 430/314 |

*Primary Examiner*—Christopher G. Young
*Attorney, Agent, or Firm*—Schwegman, Lundberg, Woessner & Kluth P.A.

[57] ABSTRACT

A method for forming a structure by redepositing a starting material on sidewalls of a foundation during an etch of the starting material.

33 Claims, 6 Drawing Sheets

METHOD FOR FORMING A STRUCTURE USING REDEPOSITION OF ETCHABLE LAYER

This application is a continuation of Ser. No. 08/905,785, filed Aug. 13, 1997.

FIELD OF THE INVENTION

The invention relates to the fabrication of semiconductors and more particularly to the fabrication of a structure formed by redepositing a starting material.

BACKGROUND OF THE INVENTION

Sidewall passivation occurs during a chemical deposition on sidewalls of a structure. Typically, sidewall passivation is used to enhance a mask in order to increase the integrity of the mask thereby eliminating undercut and other etching defects caused when portions of the mask itself are consumed during an etch. The chemical deposit is then typically removed since it is used to perform the process and is not a structural goal of the total process.

SUMMARY OF THE INVENTION

The invention is a method for forming a structure wherein a starting material is etched and redeposited during the etch on a sidewall of a foundation. In one embodiment the foundation is removed subsequent to the etch to leave the redeposited starting material and unetched staring material to form the structure. This structure may be a capacitor electrode. In this embodiment a capacitor may be formed by forming a dielectric layer and a conductive layer overlying the structure.

In a second embodiment the foundation may form an integral part of the final structure. In this case a capacitor can be formed by depositing a dielectric and a conductive layer overlying the structure.

In still a further embodiment a capacitor may be formed using a single etch wherein redeposition occurs during the single etch. In this case two conductive layers are formed overlying a substrate and a dielectric layer is formed interposed between the conductive layers. The etch is performed after masking of the layers with a foundation. The etch creates particles or portions of each layer which are then deposited on a sidewall of the foundation to create the capacitor.

When a photoresist mask is used as the foundation the size of the structure made by the method of the invention is determined only by photolithography limits. The smallest size mask definable by lithography may be used for forming the container cell.

DETAILED DESCRIPTION OF THE INVENTION

The invention is a method for forming a structure by redepositing a deposited material during an etch of the deposited material.

The redeposit is mechanical in that the etch accelerates particles of the deposited material some of which bombard sidewalls of a foundation provided to create a base on which the accelerated particles can form the redeposited material. Thus the redeposited material has the same chemical composition as the originally deposited (or formed) material.

Figure 1:
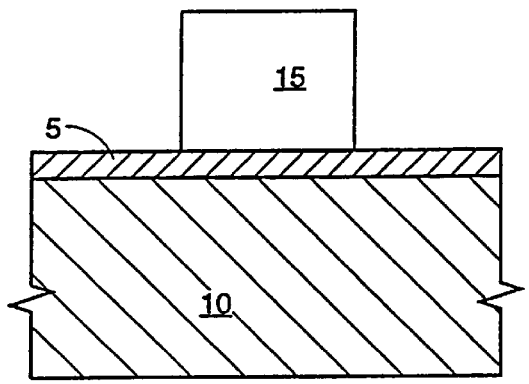
FIG. 1 is a cross-sectional view of a masked portion of a substrate having a starting material and positioned in an etching environment.

In one embodiment shown in FIG. 1 a starting material 5 is deposited to overlie a substrate 10. In a preferred embodiment the starting material 5 is platinum although other materials such as TiPt, TiNPt, TiAlN-Pt, Ru, $RuO_2$, RuPt, $RuO_2Pt$, W, WPt, WSi, Ti, TiSi, Ta, TaN, TaSi, doped and undoped Poly Si, Al, Pd and Ir may be used. A foundation 15 is formed overlying the staring material 5. In this embodiment the foundation 15 is a photoresist mask the size of which is limited only by photolithic techniques. Although the foundation 15 shown in the accompanying drawings is rectangular any shape may be formed. The staring material 5 is etched in an argon plasma environment at radio frequencies using an Ion Mill etcher as an RF ion source 20. Etching with argon in an Ion Mill etcher is well known to those skilled in the art. It is also possible to use other materials as etchants.

Figure 2:
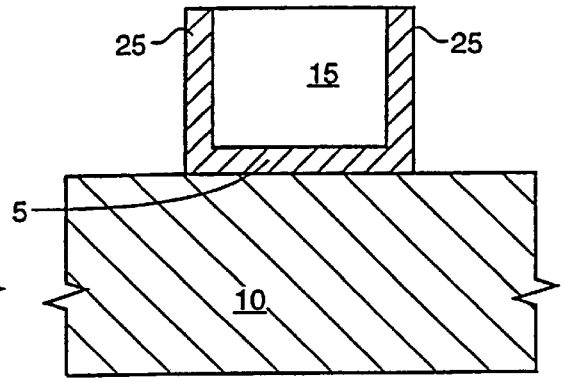
FIG. 2 is the portion of the substrate shown in FIG. 1 following an etch and redeposit of the starting material.

During etching portions of the starting material 5, in this case platinum, are redeposited as portions 25 on the sidewalls of the foundation 15, see FIG. 2. Typically, the angle of incidence between the starting material 5 and the trajectory of an accelerated etchant ion is selected to maximize the amount of redeposition of the starting material 5 on the sidewalls of the foundation 15. A 90 degree angle of incidence typically works well.

Figure 3:
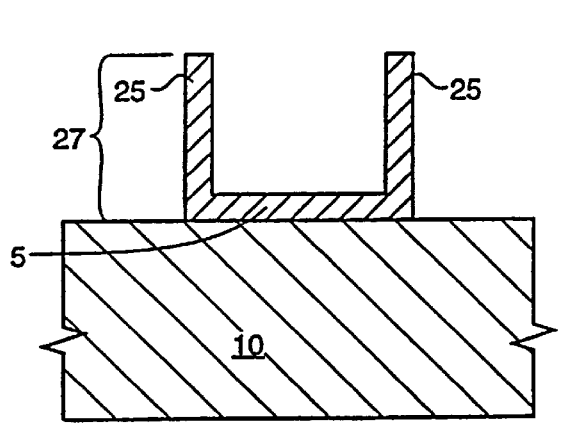
FIG. 3 is the portion of the substrate shown in FIG. 2 following the removal of the mask.
Figure 4:
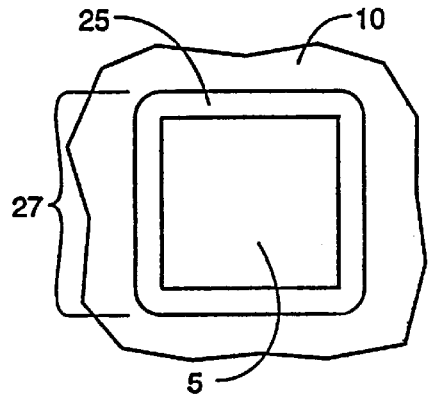
FIG. 4 is a top planar view of the portion of the substrate shown in FIG. 3.

In FIGS. 3 and 4 the photoresist has been striped leaving the structure 27 comprising platinum portions 5 and 25 formed by the method of the invention.

The platinum structure 27 may be used as a storage node electrode for a container cell capacitor. In this case the process is continued, as shown in FIGS. 5 and 6, in order to complete the capacitor fabrication.

Figure 5:
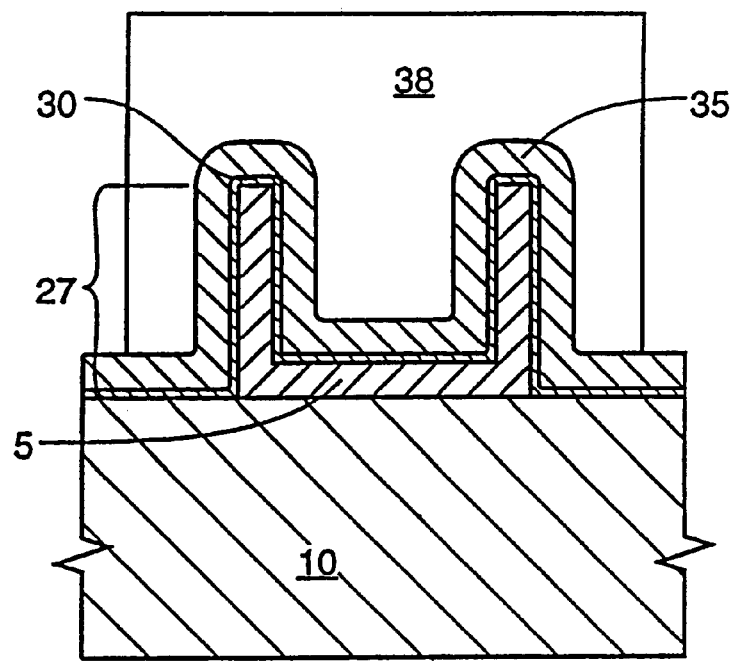
FIG. 5 is the portion of the substrate and the structure shown in FIG. 3 following the formation of a dielectric layer, a conductive layer and a mask.
Figure 6:
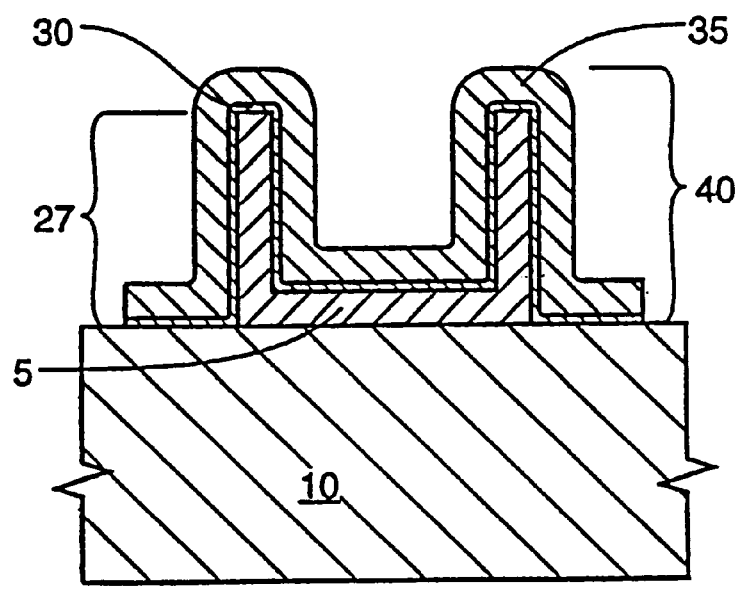
FIG. 6 is the portion of the substrate and the structure shown in FIG. 5 following an etch of the dielectric layer and the conductive layer and following the removal of the mask.

In FIG. 5 a dielectric layer 30 has been deposited to overlie the platinum structure 27. This deposition is followed by the deposition, typically a sputtering, of a conductive layer 35 to overlie the dielectric layer 30. The dielectric layer 30 and the conductive layer 35 are then patterned with mask 38. The dielectric layer 30 and the conductive layer 35 are etched according to means known to those skilled in the art to form the capacitor 40 shown in FIG. 6.

In a case where Osmium, Iridium, or Ruthenium is used in place of Platinum, the structures formed by the process of the invention may be oxidized thereby forming $OsO_x$, $IrO_2$ or $RuO_2$ respectively.

Figure 7:
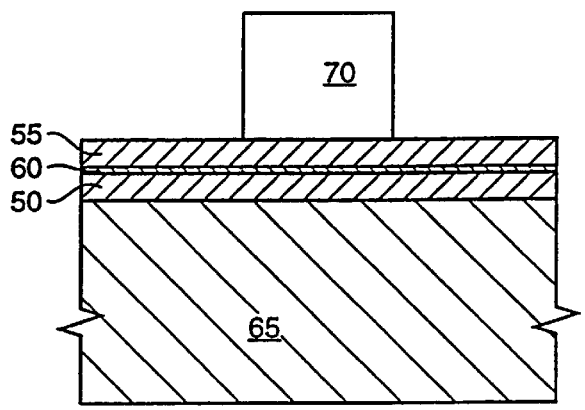
FIG. 7 is a cross-sectional view of a portion of a substrate and masked conductive layers interposed with a dielectric layer.
Figure 8:
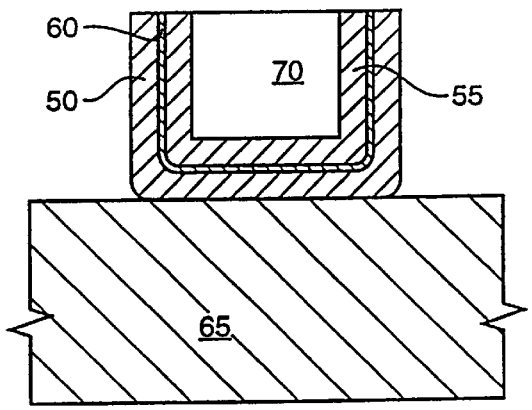
FIG. 8 is the portion of the substrate shown in FIG. 7 following etching and redeposition of the conductive layers and the dielectric layer.
Figure 9:
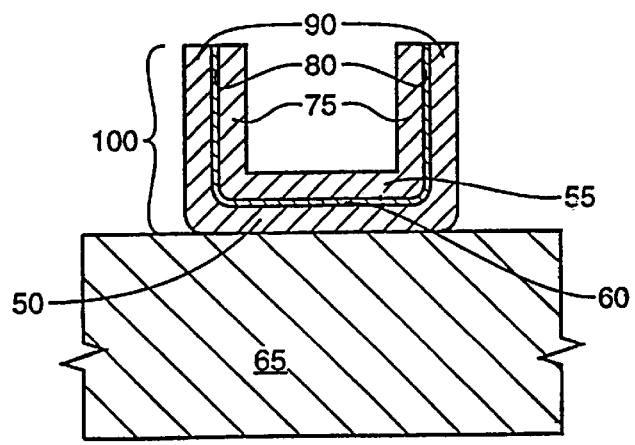
FIG. 9 is the cross sectional view of the portion of the substrate shown in FIG. 8 following the removal of the mask.

In a further embodiment, shown in FIGS. 7–9, three starting materials, two conductive layers 50 and 55 having a dielectric layer 60 interposed therein, are deposited overlying a substrate 65 (see FIG. 7). The conductive layers 50 and 55 are patterned with a foundation 70, typically a photoresist mask, and then the conductive layers 50 and 55 and the dielectric layer 60 are etched insitu, typically using a single etch step.

In FIG. 8, as conductive layer 55 is etched it is redeposited on the sidewalls of the foundation 70 to form a vertical conductive (to the substrate) layer 75. The etch continues and the dielectric layer 60 is redeposited to form a vertical dielectric layer 80. The etch further continues to etch conductive layer 50 which is redeposited during the etch as vertical conductive layer 90. Among the appropriate materials for the conductive layers 50 and 55 are platinum, conductive oxides, and polysilicon. The redeposited layers 75 and 90 are the same material as the original conductive layers 50 and 55. Therefore if 50 and 55 are platinum the redeposited layers 75 and 90 are also platinum. The same is true of the dielectric layer. Dielectric layer 60 may be chosen from a group of dielectrics selected from the group consisting of $Ba(1-x)SrxO_3$, $PbZr(1-x)TixO_3$, PZT with various dopants such as LA etc., $Sr(1-x)BixTaO_3$, $Sr(1-x)BixTiO_3$ and all of the other Smolenski compounds, $PbMg(1-x)NbxTiO_3$ (PMN), compounds with $PbTiO_3$ (PMN-PT), $CaBi_2Nb_2O_9$, $SrBi_2Nb_2O_9$, $BaBi_2Nb_2O_9$, $PbBi_2Nb_2O_9$, $BiBi_2NbTiO_9$, $BaBi_4Ti_4O_{15}$, $CaBi_2Ta_2O_9$, $SrBi_2Ta_2O_9$, $BaBi_2Ta_2O_9$, $PbBi_2Ta_2O_9$, $Bi_4Ti_3O_{12}$, $SrBi_4Ti_4O_{15}$, $BaBi_4Ti_4O_{15}$, $PbBi_4Ti_4O_{15}$, $(Pb, Sr)Bi_2Nb_2O_9$, $(Pb, Ba)Bi_2Nb_2O_9$, $(Ba, Ca)Bi_2Nb_2O_9$, $(Ba, Sr)Bi_2Nb_2O_9$, $BaBi_2Nb_2O_9$, $Ba_{0.75}Bi_{2.25}Ti_{0.25}Nb_{1.75}O_9$, $Ba_{0.5}Bi_{2.5}Ti_{0.5}Nb_{1.5}O_9$, $Ba_{0.25}Bi_{2.75}Ti_{0.75}Nb_{1.25}O_9$, $Bi_3TiNbO_9$, $SrBi_2Nb_2O_9$, $Sr_{0.8}Bi_{2.2}Ti_{0.2}Nb_{1.8}O_9$, $Sr_{0.6}Bi_{2.4}Ti_{0.4}Nb_{1.6}O_9$, $Bi_3TiNbO_9$, $PbBi_2Nb_2O_9$, $Pb_{0.75}Bi_{2.25}Ti_{0.25}Nb_{1.75}O_9$, $Pb_{0.5}Bi_{2.5}Ti_{0.5}Nb_{1.5}O_9$, $Pb_{0.25}Bi_{2.75}Ti_{0.75}Nb_{1.25}O_9$, $Bi_3TiNbO_9$, $PbBi_4Ti_4O_{15}$, $Pb_{0.75}Bi_{4.25}Ti_{3.75}Ga_{0.25}O_{15}$, $Pb_{0.5}Bi_{4.5}Ti_{3.5}Ga_{0.5}O_{15}$, and $Bi_5Ti_3GaO_{15}$. Although it is desirable, in order to minimize processing steps, to use only one etchant and only etch step it is possible to perform the method of the invention using multiple etchants or multiple etch steps.

As in the previous embodiment the foundation 70 is removed using conventional methods, see FIG. 9. The structure 100 of the invention remains. In this case the structure 100 is a storage cell capacitor formed using a single etch process performed in an argon plasma environment at radio frequencies using an Ion Mill etcher as an RF ion source wherein the angle of incidence is 90 degrees. Variations of this etch, including etchants and angle of incidence, may be used as long as the desired sidewall deposition occurs during the etch.

Figure 10:
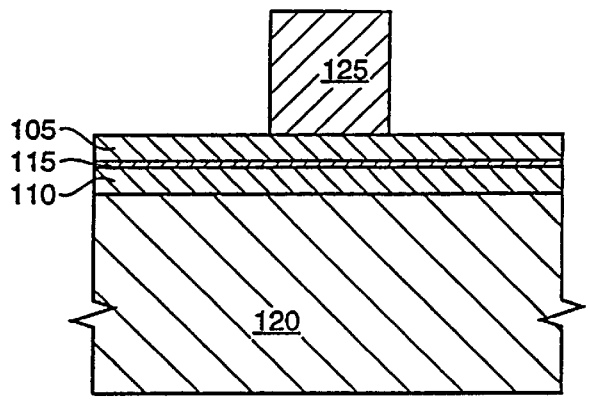
FIG. 10 is a cross-sectional view of conductive layers interposed with a dielectric layer and masked with a conductive plug and overlying a portion of a substrate.
Figure 11:
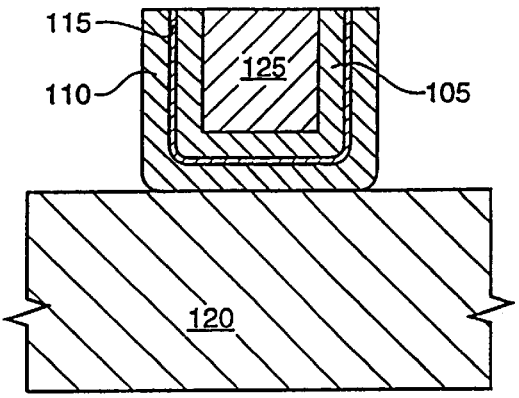
FIG. 11 is the portion of the substrate of FIG. 10 following an etch and redeposition of the conductive layers and the dielectric layer.

In still a further embodiment, as shown in FIGS. 10 and 11, two conductive layers 105 and 110, interposed with a deposited dielectric layer 115, are deposited to overlie a substrate 120. A conductive plug 125 is fabricated by conventional means to overlie conductive layer 105. A polysilicon plug is one preferred choice for the conductive plug 125 however the conductive plug 125 may be of a material selected from the group consisting of TiPt, TiNPt, TiAlN-Pt, Ru, $RuO_2$, RuPt, $RuO_2Pt$, W, WPt, WSi, Ti, TiSi, Ta, TaN, TaSi, doped and undoped Poly Si, Al, Pd and Ir. Other conductive materials may be used as well.

FIG. 11 shows the redeposition of the conductive layers 105 and 110 and the redeposition of dielectric layer 115 following an etch of the layers 105, 110, and 115. A storage node capacitor 130 is formed during the redeposition. The storage node capacitor 130 has conductive layer 110 as a storage node electrode and has conductive layer 105 and conductive plug 125 as a cell plate electrode.

Figure 12:
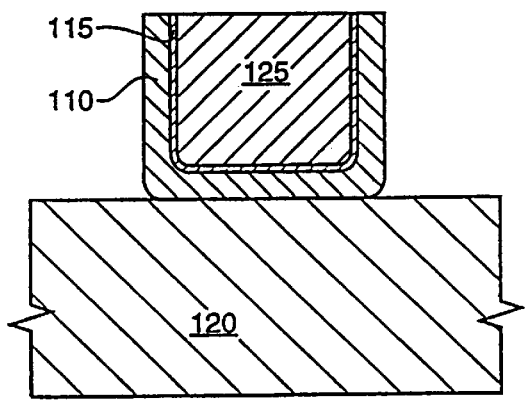
FIG. 12 is a cross-sectional view of a dielectric layer and a conductive layer redeposited on a sidewall of a conductive plug.
Figure 13:
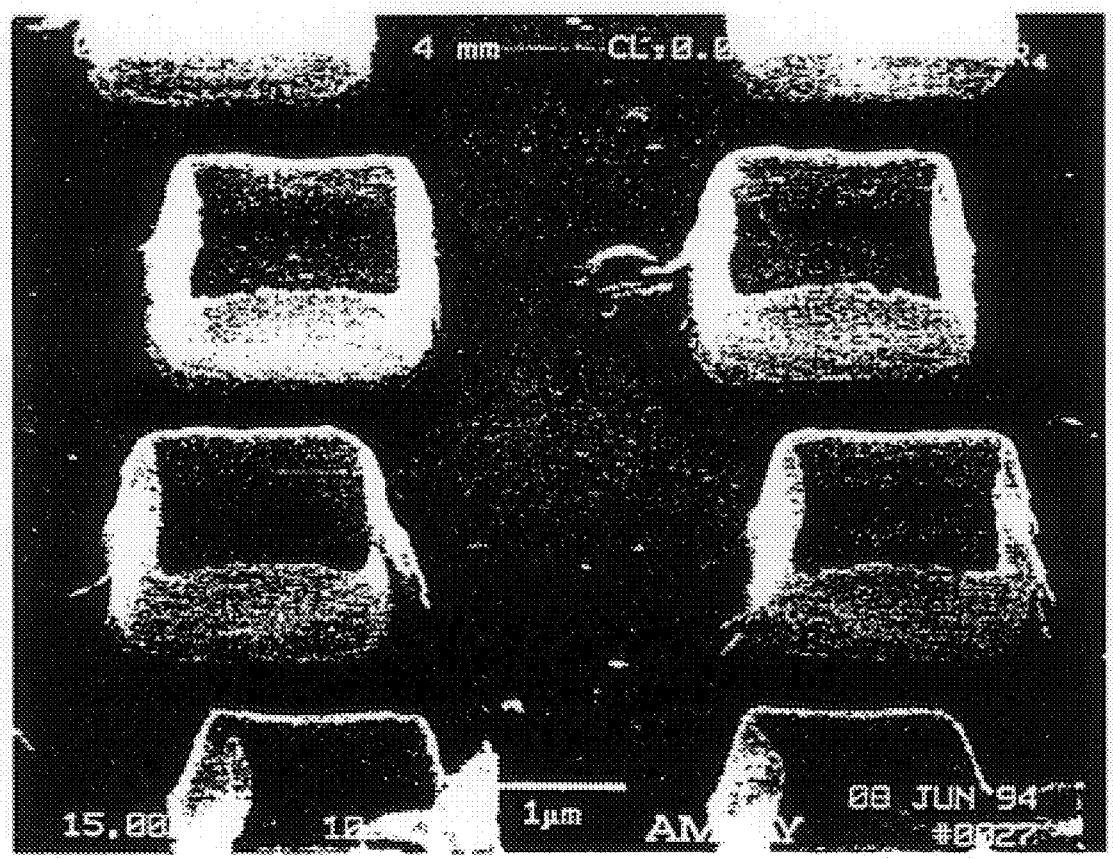
FIG. 13 is a colored copy of a photograph taken with a scanning electron microscope showing an isometric view of a structure of the invention.
Figure 14:
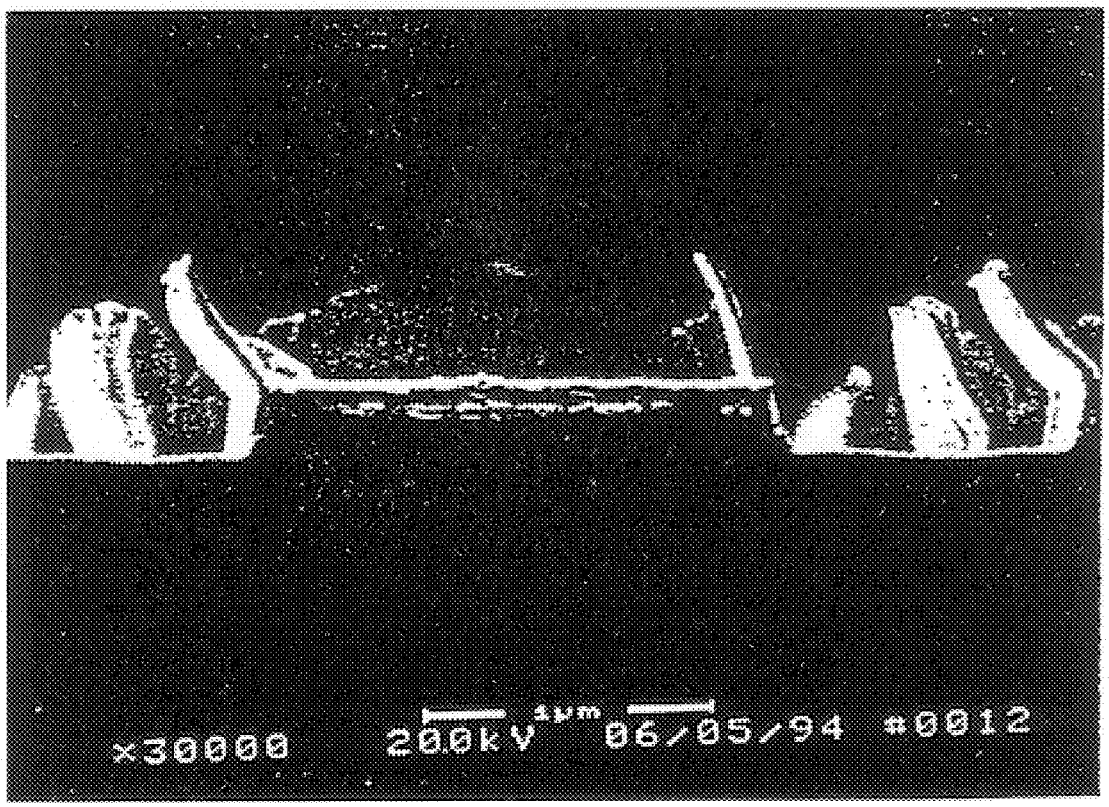
FIG. 14 is a colored copy of a photograph taken with a scanning electron microscope showing a cross-sectional view of a structure of the invention. Similar structures of the invention can be seen in the background.

In an alternate embodiment the deposition of conductive layer 105 may be eliminated. The storage node electrode thus formed has conductive layer 110 as the storage node electrode and has the conductive plug 125 as the cell plate electrode, see FIG. 12.

While the invention has been described in its preferred embodiments it is to be understood that the words which have been used are words of description rather than limitation and that changes may be made within the purview of the appended claims without departing from the true scope and spirit of the invention in its broader aspects.

What is claimed is:

1. A method for fabricating a semiconductor structure, comprising:

forming a first layer of material;

forming a patterned foundation overlying the first layer;

accelerating particles of exposed portions of the first layer; and redepositing a portion of the accelerated particles of the first layer upon sidewalls of the patterned foundation.

2. The method of claim 1 wherein forming a first layer of material comprises forming a layer of conductive material.

3. The method of claim 1 wherein forming a first layer of material comprises a conductive material selected from the group consisting of Pt, TiPt, TiNPt, TiAlN-Pt, Ru, $RuO_2$, RuPt, $RuO_2Pt$, W, WPt, WSi, Ti, TiSi, Ta, TaN, TaSi, doped polysilicon, undoped polysilicon, Al, Pd and Ir.

4. The method of claim 1 wherein accelerating particles of exposed portions of the first layer comprises etching the first layer.

5. The method of claim 4 wherein etching the first layer comprises etching with an RF ion source.

6. The method of claim 5 wherein etching with an RF ion source comprises bombarding the first layer with ions using an angle of incidence sufficient to cause the accelerated particles of exposed portions of the first layer to redeposit upon the sidewalls of the patterned foundation.

7. The method of claim 5 wherein etching with an RF ion source comprises bombarding the first layer with ions using an angle of incidence of approximately ninety degrees.

8. The method of claim 1 wherein forming a patterned foundation comprises forming a photoresist mask.

9. The method of claim 1 wherein forming a patterned foundation comprises forming a rectangular pattern.

10. The method of claim 1 further comprising removing the patterned foundation.

11. A method of fabricating a semiconductor structure, comprising:

forming a first conductive layer;
   forming a patterned foundation overlying the first conductive layer;
   etching exposed portions of the first conductive layer;
   redepositing a portion of the etched first conductive layer on sidewalls of the patterned foundation;
   removing the patterned foundation to expose a concave structure;
   forming a dielectric layer overlying the concave structure; and
   forming a second conductive layer overlying the dielectric layer.

12. The method of claim 11 wherein forming a first conductive layer comprises Pt.

13. The method of claim 11 wherein forming a first conductive layer comprises a material selected from the group consisting of Os, Ir and Ru.

14. The method of claim 13 further comprising oxidizing the concave structure.

15. A method for fabricating a semiconductor structure, comprising:

forming a first conductive layer;
   forming a dielectric layer overlying the first conductive layer;
   forming a second conductive layer overlying the dielectric layer;
   forming a patterned foundation overlying the second conductive layer;
   accelerating particles of exposed portions of the second conductive layer;
   redepositing a portion of the accelerated particles of the second conductive layer upon sidewalls of the patterned foundation;
   accelerating particles of exposed portions of the dielectric layer;
   redepositing a portion of the accelerated particles of the dielectric layer upon the portion of redeposited particles of the second conductive layer;
   accelerating particles of exposed portions of the first conductive layer; and
   redepositing a portion of the accelerated particles of the first conductive layer upon the portion of redeposited particles of the dielectric layer.

16. The method of claim 15 wherein forming a first conductive layer comprises a conductive material selected from the group consisting of Pt, conductive oxides and polysilicon.

17. The method of claim 15 wherein forming a dielectric layer comprises a dielectric selected from the group consisting of $Ba(1-x)Sr_xO_3$, $PbZr(1-x)Ti_xO_3$, doped PZT, $Sr(1-x)Bi_xTaO_3$, Smolenski compounds, $PbMg(1-x)Nb_xTiO_3$ (PMN), $PbTiO_3$ (PMN-PT), $CaBi_2Nb_2O_9$, $BiBi_2NbTiO_9$, $CaBi_2Ta_2O_9$, $SrBi_2Ta_2O_9$, $BaBi_2Ta_2O_9$, $PbBi_2Ta_2O_9$, $Bi_4Ti_3O_{12}$, $SrBi_4Ti_4O_{15}$, $BaBi_4Ti_4O_{15}$, $(Pb,Sr)Bi_2Nb_2O_9$, $(Pb,Ba)Bi_2Nb_2O_9$, $(Ba,Ca)Bi_2Nb_2O_9$, $(Ba, Sr)Bi_2Nb_2O_9$, $BaBi_2Nb_2O_9$, $Ba_{0.75}Bi_{2.25}Ti_{0.25}Nb_{1.75}O_9$, $Ba_{0.5}Bi_{2.5}Ti_{0.5}Nb_{1.5}O_9$, $Ba_{0.25}Bi_{2.75}Ti_{0.75}Nb_{1.25}O_9$, $SrBi_2Nb_2O_9$, $Sr_{0.8}Bi_{2.2}Ti_{0.2}Nb_{1.8}O_9$, $Sr_{0.6}Bi_{2.4}Ti_{0.4}Nb_{1.6}O_9$, $PbBi_2Nb_2O_9$, $Pb_{0.75}Bi_{2.25}Ti_{0.25}Nb_{1.75}O_9$, $Pb_{0.5}Bi_{2.5}Ti_{0.5}Nb_{1.5}O_9$, $Pb_{0.25}Bi_{2.75}Ti_{0.75}Nb_{1.25}O_9$, $Bi_3TiNbO_9$, $PbBi_4Ti_4O_{15}$, $Pb_{0.7}Bi_{4.25}Ti_{3.75}Ga_{0.25}O_{15}$, $Pb_{0.5}Bi_{4.5}Ti_{3.5}Ga_{0.5}O_{15}$ and $Bi_5Ti_3GaO_{15}$.

18. The method of claim 15 wherein forming a second conductive layer comprises a material selected from the group consisting of Pt, conductive oxides and polysilicon.

19. The method of claim 15 wherein accelerating particles of exposed portions comprises etching the exposed portions.

20. The method of claim 19 wherein etching the exposed portions comprises etching with an RF ion source.

21. The method of claim 20 wherein etching with an RF ion source comprises bombarding the exposed portions with ions using an angle of incidence of approximately ninety degrees.

22. The method of claim 15 wherein forming a patterned foundation comprises forming a photoresist mask.

23. The method of claim 15 wherein forming a patterned foundation comprises forming a rectangular pattern.

24. The method of claim 15 further comprising removing the patterned foundation.

25. A method for fabricating a semiconductor structure, comprising:

forming a conductive layer;
   forming a dielectric layer overlying the conductive layer;
   forming a patterned foundation overlying the dielectric layer;
   accelerating particles of exposed portions of the dielectric layer;
   redepositing a portion of the accelerated particles of the dielectric layer upon sidewalls of the patterned foundation;
   accelerating particles of exposed portions of the conductive layer; and
   redepositing a portion of the accelerated particles of the conductive layer upon the portion of redeposited particles of the dielectric layer.

26. The method of claim 25 wherein forming a conductive layer comprises a material selected from the group consisting of Pt, conductive oxides and polysilicon.

27. The method of claim 25 wherein forming a dielectric layer comprises a dielectric selected from the group consisting of $Ba(1-x)Sr_xO_3$, $PbZr(1-x)Ti_xO_3$, doped PZT, $Sr(1-x)Bi_xTaO_3$, $Sr(1-x)Bi_xTiO_3$, Smolenski compounds, $PbMg(1-x)Nb_xTiO_3$ (PMN), $PbTiO_3$ (PMN-PT), $CaBi_2Nb_2O_9$, $BiBi_2NbTiO_9$, $CaBi_2Ta_2O_9$, $SrBi_2Ta_2O_9$, $BaBi_2Ta_2O_9$, $PbBi_2Ta_2O_9$, $Bi_4Ti_3O_{12}$, $SrBi_4Ti_4O_{15}$, $BaBi_4Ti_4O_{15}$, $(Pb,Sr)Bi_2Nb_2O_9$, $(Pb,Ba)Bi_2Nb_2O_9$, $(Ba,Ca)Bi_2Nb_2O_9$, $(Ba, Sr)Bi_2Nb_2O_9$, $BaBi_2Nb_2O_9$, $Ba_{0.75}Bi_{2.25}Ti_{0.25}Nb_{1.75}O_9$, $Ba_{0.5}Bi_{2.5}Ti_{0.5}Nb_{1.5}O_9$, $Ba_{0.25}Bi_{2.75}Ti_{0.75}Nb_{1.25}O_9$, $SrBi_2Nb_2O_9$, $Sr_{0.8}Bi_{2.2}Ti_{0.2}Nb_{1.8}O_9$, $Sr_{0.6}Bi_{2.4}Ti_{0.4}Nb_{1.6}O_9$, $PbBi_2Nb_2O_9$, $Pb_{0.75}Bi_{2.25}Ti_{0.25}Nb_{1.75}O_9$, $Pb_{0.5}Bi_{2.5}Ti_{0.5}Nb_{1.5}O_9$, $Pb_{0.25}Bi_{2.75}Ti_{0.75}Nb_{1.25}O_9$, $Bi_3TiNbO_9$, $PbBi_4Ti_4O_{15}$, $Pb_{0.7}Bi_{4.25}Ti_{3.75}Ga_{0.25}O_{15}$, $Pb_{0.5}Bi_{4.5}Ti_{3.5}Ga_{0.5}O_{15}$ and $Bi_5Ti_3GaO_{15}$.

28. The method of claim 25 wherein accelerating particles of exposed portions comprises etching the exposed portions.

29. The method of claim 28 wherein etching the exposed portions comprises etching with an RF ion source.

30. The method of claim 29 wherein etching with an RF ion source comprises bombarding the exposed portions with ions using an angle of incidence of approximately ninety degrees.

31. The method of claim 25 wherein forming a patterned foundation comprises forming a photoresist mask.

32. The method of claim 25 wherein forming a patterned foundation comprises forming a rectangular pattern.

33. The method of claim 25 wherein forming a patterned foundation comprises a conductive material selected from the group consisting of Pt, TiPt, TiNPt, TiAlN-Pt, Ru, $RuO_2$, RuPt, $RuO_2$Pt, W, WPt, WSi, Ti, TiSi, Ta, TaN, TaSi, doped polysilicon, undoped polysilicon, Al, Pd and Ir.

* * * * *

UNITED STATES PATENT AND TRADEMARK OFFICE
CERTIFICATE OF CORRECTION

PATENT NO.: 6,027,860
DATED: Feb. 22, 2000
INVENTOR(S): McClure et al.

It is certified that error appears in the above-identified patent and that said Letters Patent is hereby corrected as shown below:

In column 3, line 14, delete "Irdium" and insert --Iridium--, therefor.

In column 3, line 58, delete "etch step" and insert --one etch step--, therefor.

In column 4, line 6, delete "deposited dielectric layer 115, are deposited to overlie" and insert --deposited dielectric layer 115, are deposited to overlie--, therefor.

In column 5, line 56, insert --$Sr(1-x)Bi_xTiO_3$-- after "$x)Bi_xTaO_3$,".

In column 6, line 45, delete "$Sr(1-x)Bi_xTaO$,," and insert --$Sr(1-x)Bi_xTaO_3$,--, therefor.

Signed and Sealed this

Eighth Day of May, 2001

*Attest:*

NICHOLAS P. GODICI

*Attesting Officer*     Acting Director of the United States Patent and Trademark Office